United States Patent
Ogawa (10) Patent No.: US 8,116,699 B2
(45) Date of Patent: Feb. 14, 2012

(54) TRANSMITTER (75) Inventor: Ryutaro Ogawa, Tokyo (JP)

(73) Assignee: NEC Corporation, Tokyo (JP)

( * ) Notice: Subject to any disclaimer, the term of this patent is extended or adjusted under 35 U.S.C. 154(b) by 534 days.

(21) Appl. No.: 12/375,664

(22) PCT Filed: Jul. 13, 2007

(86) PCT No.: PCT/JP2007/063974
§ 371 (c)(1),
(2), (4) Date: Jan. 29, 2009

(87) PCT Pub. No.: WO2008/015898
PCT Pub. Date: Feb. 7, 2008

(65) Prior Publication Data
US 2010/0022207 A1 Jan. 28, 2010

(30) Foreign Application Priority Data

Aug. 2, 2006 (JP) .................................. 2006-210427

(51) Int. Cl.
*H04B 1/04* (2006.01)

(52) U.S. Cl. ...................... 455/103; 455/63.1; 455/67.13

(58) Field of Classification Search ................. 455/63.1, 455/67.13, 103, 114.2, 127.2
See application file for complete search history.

(56) References Cited

U.S. PATENT DOCUMENTS 4,032,858 A * 6/1977 Hargis ........................... 455/265
7,848,716 B2 * 12/2010 Furuya et al. ............... 455/114.2

FOREIGN PATENT DOCUMENTS

| JP | 4-233809 A | 8/1992 |
| JP | 2003046408 A | 2/2003 |
| JP | 2003289255 A | 10/2003 |
| JP | 2003298431 A | 10/2003 |
| JP | 2006080810 A | 3/2006 |

OTHER PUBLICATIONS

International Search Report for PCT/JP2007/063974 mailed Sep. 18, 2007.
Japanese Office Action for JP2005-52769 Issued Aug. 16,2011.

* cited by examiner

*Primary Examiner* — Quochien B Vuong (57) ABSTRACT

To provide a transmitter wherein even in a case of sharing a detector circuit between or among a plurality of transmitting circuits, a high degree of detection accuracy can be achieved without increasing the signal power supplied to the detector circuit. In a transmitter including a detector circuit 14 shared by transmitting circuits 1 and 2 that deal with signals of different frequency bands, a capacitor C1, which constitutes an RF coupler disposed on an output signal line of the transmitting circuit 1, is directly connected to the input terminal of the detector circuit 14, while series coils L1 and L2 are inserted between a capacitor C2, which makes up an RF coupler disposed on an output signal line of the transmitting circuit 2 which deals with signals of a lower frequency band than the transmitting circuit 1, and the input terminal of the detector circuit 14.

13 Claims, 6 Drawing Sheets

TO DETECTOR CIRCUIT

TRANSMITTER

REFERENCE TO RELATED APPLICATION

The present invention is the National Phase of PCT/JP2007/063974, filed Jul. 13, 2007, which is based upon and claims the benefit of the priority of Japanese patent application No. 2006-210427, filed on Aug. 2, 2006, the disclosure of which is incorporated herein in its entirety by reference thereto.

The present invention relates to a transmitter, and more specifically to a transmitter wherein a detector circuit is shared among a plurality of transmitting circuits that deal with signals of different frequency bands.

BACKGROUND ART

Figure 6:
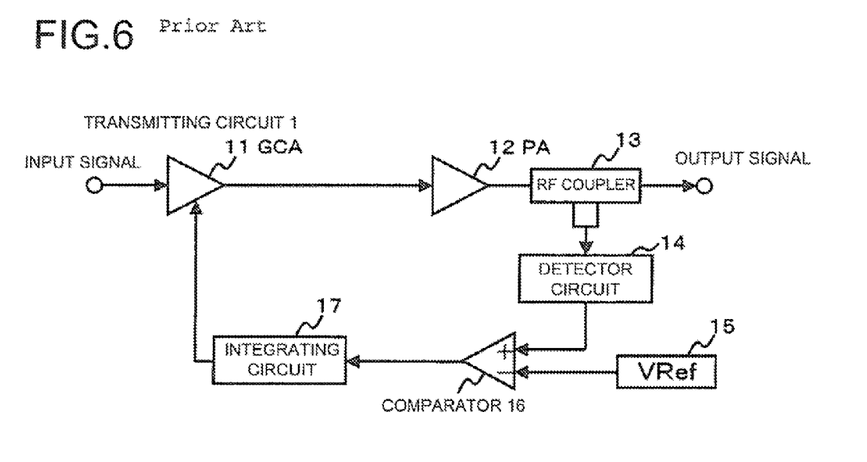
FIG. 6 is a diagram showing a formulation of a conventional transmitter with a single transmitting circuit.
Figure 7:
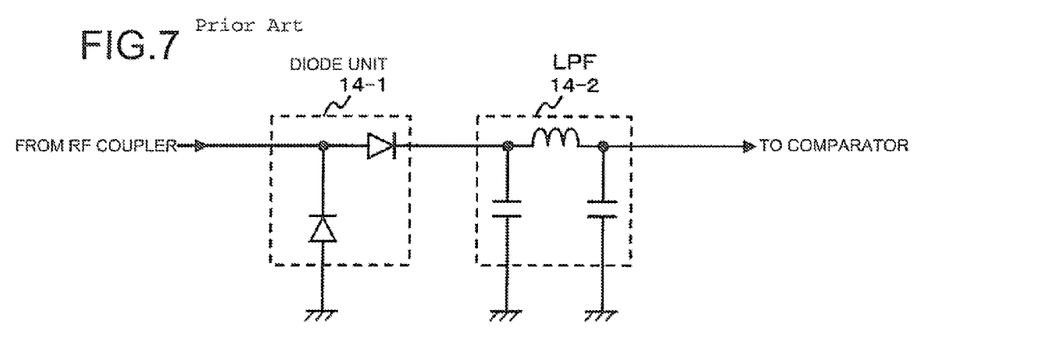
FIG. 7 is a diagram showing a formulation of the detector circuit in FIG. 6.

FIG. 6 is a diagram showing an example of a formulation of a conventional transmitter in case of having only one transmitting circuit. In FIG. 6, the conventional transmitter comprises a GCA (Gain Control Amplifier) 11 which makes up a transmitting circuit 1, a PA (Power Amplifier) 12 which makes up the transmitting circuit 1, an RF (Radio Frequency) coupler 13, a detector circuit 14; a reference voltage generator 15, a comparator 16, and an integrating circuit 17. FIG. 7 is a diagram showing a structure of the detector circuit 14 in FIG. 6. The detector circuit 14 comprises a diode unit 14-1 and a LPF (Low-Pass Filter) 14-2. The detector circuit 14 may comprise a detector IC instead of the diode unit.

The GCA 11 is an amplifier whose gain can be variably controlled by an external analog voltage. The PA 12 is an amplifier disposed at the final stage of the transmitting circuit; and it has a constant gain. The RF coupler 13 branches a radio frequency signal power output from the PA 12 and supplies part of the power to the detector circuit 14. The detector circuit 14 detects the branched radio frequency signal power and outputs it as a detection signal. The detection voltage should be higher by a certain level than the noise floor to improve its error estimation accuracy. The comparator 16 compares the detection voltage with a reference voltage VRef of a target transmission power generated by the reference voltage generator 15 and outputs a difference voltage. The difference voltage is integrated by the integrating circuit 17 and input to the GCA 11 as a feedback; therefore, the gain of the GCA 11 is variably controlled.

A high accuracy in the power detection is required for the detector circuit 14, because the circuit 14 is used for the purpose of controlling the output power of the transmitting circuit accurately toward a predetermined value. Therefore, the output voltage (detection voltage) of the detector circuit 14 should be high enough above the noise floor level.

Figure 8:
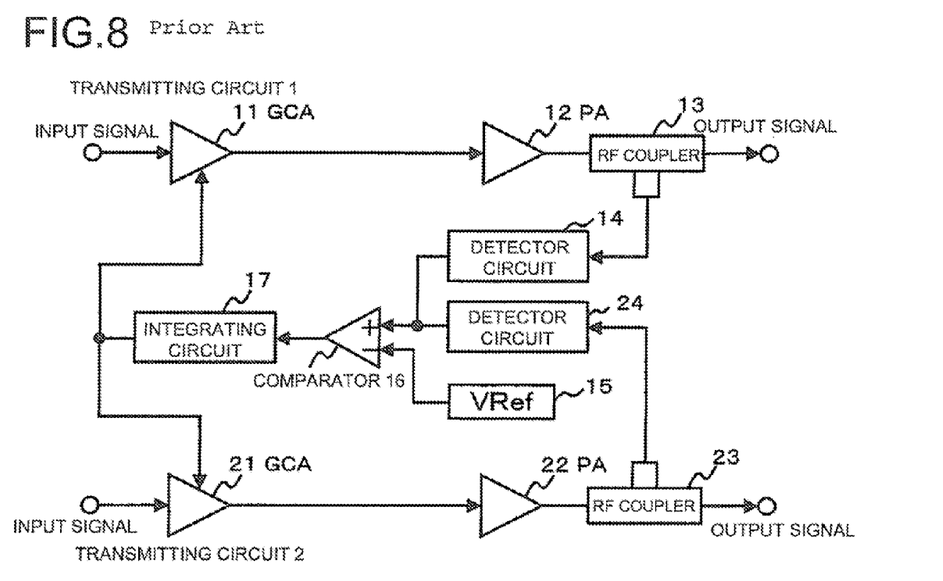
FIG. 8 is a diagram showing a formulation of a conventional transmitter with two transmitting circuits.

In general, if there is provided a plurality of transmitting circuits each deals with different frequency bands, a detector circuit is equipped for each of the transmitting circuits. FIG. 8 is a diagram showing a formulation of a conventional transmitter with two transmitting circuits, wherein an equivalent component with that in FIG. 6 is indicated by an identical reference numeral. As well as the components in FIG. 6, the transmitter shown in FIG. 8 further comprises a GCA 21 which makes up a transmitting circuit 2, a PA 22 which makes up the transmitting circuit 2, an RF coupler 23 for branching a radio frequency signal power output from the PA 22 and supplying part of the power to a detector circuit 24, and a detector circuit 24 for detecting the branched radio frequency signal power output. A structure of the detector circuit 24 is similar to that in the detector circuit 14 shown in FIG. 7.

The transmitting circuit 1 and the transmitting circuit 2 are operated exclusively to each other; while one is in operation, the other is stopped. For example, the transmitting circuit 1 deals with signals of a radio frequency band (for example, 2 GHz band); and the transmitting circuit 2 deals with signals of a low frequency band (for example, 800 MHz band).

In this case, since the detector circuit in one transmitting circuit is independent from the detector circuit in the other transmitting circuit, interference between the detector circuit 14 and 24 does not occur and a detection voltage which is higher than a certain level is easily generated. However, since a plurality of detector circuits is required, there is a disadvantage from viewpoints of cost and mounting area.

Figure 9:
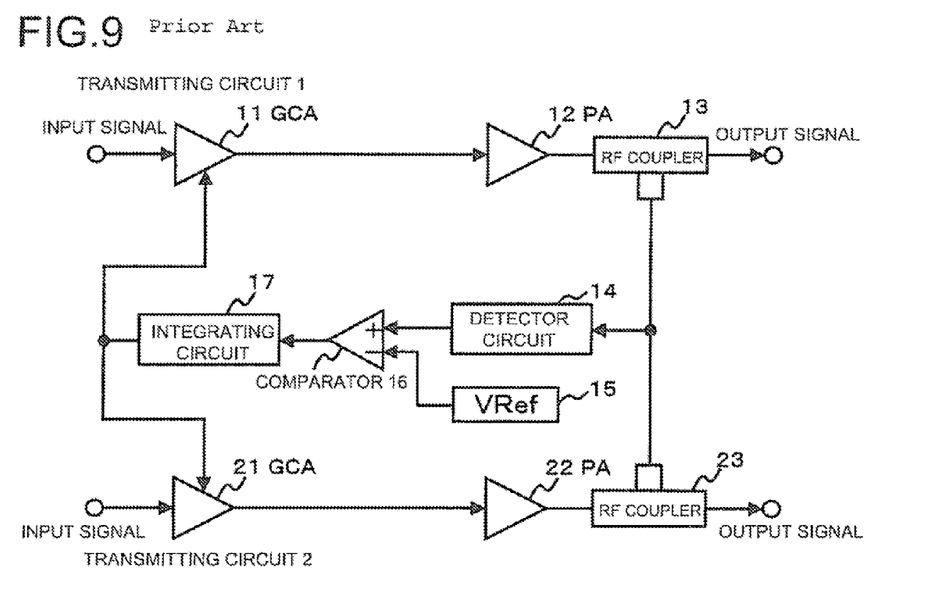
FIG. 9 is a diagram showing another formulation of a conventional transmitter with two transmitting circuits.

FIG. 9 is a diagram showing another structure of a conventional transmitter with two transmitting circuits, wherein an equivalent component with that in FIG. 8 is indicated by an identical reference numeral. The transmitter shown in FIG. 9 is different from that shown in FIG. 8 in that, by sharing the detector circuit 14 between the transmitting circuits 1 and 2, the detector circuit 24 is removed. When a detector circuit is shared among a plurality of transmitting circuits in this way, there is an advantage that cost and mounting area are reduced compared with the formulation shown in FIG. 8.

For example, Patent Document 1 describes a formulation wherein a detector circuit is shared among a plurality of transmitting circuits.
[Patent Document 1]
  JP Patent Kokai Publication No. JP-P2006-080810A
[Patent Document 2]
  JP Patent Kokai Publication No. JP-P2003-046408A

DISCLOSURE OF THE INVENTION

Problems to be Solved by the Invention

The disclosures of the Patent Documents 1 and 2 above are incorporated herein by reference thereto. The following analysis of the related art is given by the present invention. In the formulation shown in FIG. 9, interference between the transmitting circuits 1 and 2 occurs and the detection sensitivity changes depending on frequencies. Moreover, the sensitivity is decreased due to leakage of the power for detection into a transmitting circuit for the other frequency band. Therefore, to realize a minimum detection voltage at the same level with the case where the detector circuit is not shared, it is necessary to increase the radio frequency signal power supplied to the detector circuit. As a result, it is necessary to increase an output power from the PA and the GCA; and there occurs a problem that current consumption increases.

Patent Document 2 describes a formulation, wherein transmitting signals from transmitting units TX1 and TX2 which deal with signals of different frequency bands are merged at a diplexer unit which comprises a LPF and a HPF (High Pass Filter) and transmitted to a common antenna. This formulation prevents the transmitting signal from leaking into another transmitting unit; however, the formulation increases the number of the components.

It is an object of the present invention to provide a transmitter wherein even in a case of sharing a detector circuit between or among a plurality of transmitting circuits, a high detection accuracy can be achieved without increasing the signal power supplied to the detector circuit.

Means to Solve the Problems

According to a first aspect of the present invention, there is provided a transmitter comprising: a first transmitting circuit which corresponds to a signal of a first frequency band; a second transmitting circuit which corresponds to a signal of a second frequency band having a lower frequency band than the first frequency band; a first coupler which, disposed on an output signal line of the first transmitting circuit, branches and outputs part of an output signal from the first transmitting circuit; a second coupler which, disposed on an output line of the second transmitting circuit, branches and outputs part of an output signal from the second transmitting circuit; and a detector circuit detecting an input signal whose input terminal is coupled to a branched output terminal of the first coupler and a branched output terminal of the second coupler, wherein the input terminal is directly connected to the branched output terminal of the first coupler; and a filter circuit which, arranged between the input terminal and the branched output terminal of the second coupler, selectively passes a signal of the second frequency band.

In the above transmitter, the filter circuit may be a series of coils (inductors) arranged between the input terminal and the branched output terminal of the second coupler.

In the above transmitter, the first coupler may be a first capacitor whose first terminal is coupled to a output signal line of the first transmitting circuit and second terminal is coupled to the input terminal; the second coupler may be a second capacitor whose first terminal is connected to an output signal line of the second transmitting circuit; a first coil of the coils, whose first terminal is connected to the input terminal, may be disposed near the first capacitor; and a second coil of the coils, whose first terminal is connected to a second terminal of the first coil and second terminal is connected to a second terminal of the second capacitor, may be disposed near the second capacitor In the above transmitter, the coil may be substituted by a capacitor.

The above transmitter may further comprise: a third transmitting circuit which corresponds to signals of a third frequency band having a lower frequency band than the second frequency band; and a third coupler which, disposed on an output signal line of the third transmitting circuit, branches and outputs part of an output signal from the third transmitting circuit, wherein a filter circuit which, arranged between the input terminal and a branched output terminal of the third coupler, selectively passes a signal of the third frequency band.

According to a second aspect of the present invention, there is provided a transmitter comprising: a first transmitting circuit which corresponds to a signal of a first frequency band; a second transmitting circuit which corresponds to a signal of a second frequency band having a lower frequency band than the first frequency band; a first coupler which, disposed on an output signal line of the first transmitting circuit, branches and outputs part of an output signal from the first transmitting circuit; a second coupler which, disposed on an output line of the second transmitting circuit, branches and outputs part of an output signal from the second transmitting circuit; and a detector circuit detecting an input signal whose input terminal is coupled to a branched output terminal of the first coupler and a branched output terminal of the second coupler, wherein the input terminal is directly connected to the branched output terminal of the first coupler; and a phase shifter, providing a signal of the first frequency band with a larger phase shift than that for a signal of the second frequency band, is arranged between the input terminal and the branched output terminal of the second coupler.

The above transmitter may further comprise a controller which variably controls a gain of a variable gain amplifier in the first transmitting circuit based on a detection output of the detector circuit while the first transmitting circuit is operated and variably controls a gain of a variable gain amplifier in the second transmitting circuit based on a detection output of the detector circuit while the second transmitting circuit is operated.

In this way, according to the present invention, in a transmitter including a detector circuit shared by a first transmitting circuit and a second transmitting circuit, a branched output terminal of a first coupler disposed on an output signal line of the first transmitting circuit is directly connected to an input terminal of a detector circuit; and a filter circuit or a phase shifter is arranged between a branched output terminal of a second coupler disposed on an output signal line of the second transmitting circuit which deals with signals of the lower frequency band than the first transmitting circuit, and the input terminal of the detector circuit.

According to a third aspect of the present invention, there is provided a transmitter comprising: a first transmitting circuit which corresponds to a signal of a first frequency band; a second transmitting circuit which corresponds to a signal of a second frequency band having a lower frequency band than the first frequency band; a detector circuit which detects an input signal; a first coupler which, disposed on an output signal line of the first transmitting circuit, branches and outputs part of an output signal from the first transmitting circuit to the detector circuit; and a second coupler which, disposed on an output line of the second transmitting circuit, branches and outputs part of an output signal from the second transmitting circuit to the detector circuit; and the transmitter further comprising, between the second coupler and the detector circuit, one of a filter circuit which selectively passes a signal of the second frequency band and a phase shifter which provides a signal of the first frequency band with a larger phase shift than that for a signal of the second frequency band.

The above transmitter may further comprise: a third transmitting circuit which corresponds to signals of a third frequency band having a lower frequency band than the second frequency band; and a third coupler which branches part of an output signal of the third transmitting circuit in an output signal line of the third transmitting circuit and outputs the part to the detector circuit, and a second filter circuit which, arranged between the second coupler and the detector circuit, selectively passes a signal of the third frequency band.

In the above transmitter, both of the filter circuits may be a coil or series coils.

In the above transmitter, both of the filter circuits may be a capacitor.

In the above transmitter, both of the first coupler and the second coupler may be a capacitor.

The above transmitter may further comprise a controller which variably controls a gain of a variable amplifier in the first transmitting circuit based on a detection output of the detector circuit while the first transmitting circuit operates and variably controls a gain of a variable gain amplifier in the second transmitting circuit based on a detection output of the detector circuit while the second transmitting circuit operates.

Meritorious Effects of the Invention

According to the present invention, in a transmitter including a detector circuit shared by a first transmitting circuit and a second transmitting circuit, to reduce the power loss, a filter circuit or a phase shifter is arranged between a branched output terminal of a second coupler disposed on an output signal line of the second transmitting circuit which deals with signals of the lower frequency band than the first transmitting circuit and an input terminal of the detector circuit. Therefore, there is provided an advantage that even in a case of sharing a detector circuit between or among a plurality of transmitting circuits, a high degree of detection accuracy can be achieved without increasing the signal power supplied to the detector circuit.

EXPLANATIONS OF SYMBOLS 1, 2, 3 Transmitting circuit
11, 21 GCA (Gain Control Amplifier)
12, 22, 32 PA (Power Amplifier)
13 RF coupler
14 Detector circuit
14-1 Diode unit
14-2 LPF (Low-Pass Filter)
15 Reference voltage generator
16 Comparator
17 Integrating circuit
101 Phase shifter
C1, C2, C3 Capacitor
L1, L2, L3, L4 Coil

PREFERRED MODES FOR CARRYING OUT THE INVENTION

In the following, a preferred mode of the present invention is described with reference to the drawings.

Figure 1A:
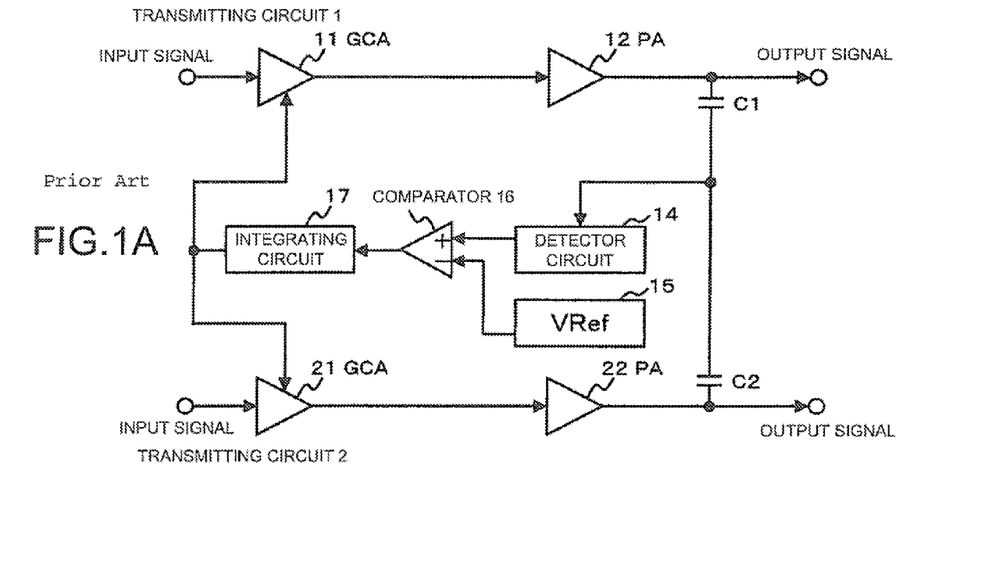
FIG. 1A is a diagram showing a formulation of a conventional transmitter to illustrate a first mode of the present invention.
Figure 1B:
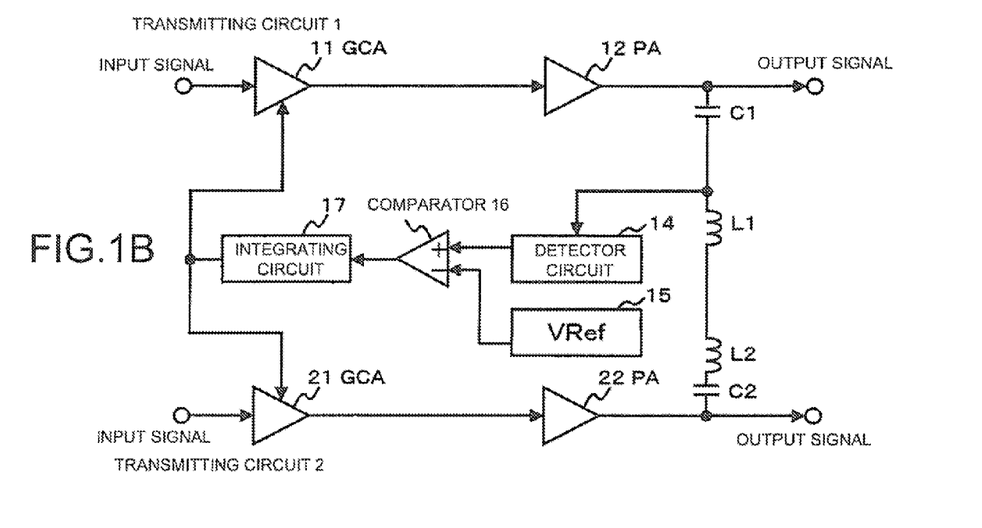
FIG. 1B is a diagram showing a formulation of a transmitter according to the first mode of the present invention.

FIG. 1A is a diagram showing a formulation of a conventional transmitter for illustrating a first mode of the present invention. FIG. 1B is a diagram showing a formulation of a transmitter according to the first mode of the present invention, where an equivalent component with that in FIG. 9 is indicated by an identical reference numeral.

In FIGS. 1A and 1B, the transmitting circuit 1 and the transmitting circuit 2 are operated exclusively to each other; while one is in operation, the other is stopped. For example, the transmitting circuit 1 deals with signals of a frequency band (for example 2 GHz band); and the transmitting circuit 2 deals with signals of a low frequency band (for example, 800 MHz band).

With reference to FIG. 1A, a formulation of a transmitter is shown, which employs, as an RF coupler 13 in FIG. 9, a capacitor C1 whose first terminal is connected to an output signal line of the first transmitting circuit 1 and second terminal is connected to an input terminal of a detector circuit 14 and employs, as an RF coupler 23 in FIG. 9, a capacitor C2 whose first terminal is connected to an output signal line of the transmitting circuit 2 and second terminal is coupled to an output terminal of the detector circuit 14.

A frequency of signals (signal 1) for the transmitting circuit 1 is denoted by f1 and a frequency of signals (signal 2) for the transmitting circuit 2 is denoted by f2. Now it is assumed that f1=2*f2.

If it is assumed that sensitivity and an input impedance of the detector circuit 14 for f1 are the same with those for f2, a power in the transmitting circuit 1 required for the detector circuit 14 to achieve a detection voltage is the same with that in the transmitting circuit 2. Therefore, an impedance of C1 at f1 is the same with that of C2 at f2.

An impedance Z of a capacitor with capacitance C at a frequency f can be calculated based on the following equation (1)

$$Z=1/(2\pi*f*C) \quad (1)$$

Therefore, an impedance Z1 of C1 at the frequency f1 is given by $$Z1=1/(2\pi*f1*C1) \quad (2)$$

and an impedance Z2 of C2 at the frequency f2 is given by $$Z2=1/(2\pi*f2*C2) \quad (3).$$

Moreover, since f1=2*f2, the relation between C1 and C2 is given by $$2*C1=C2.$$

Therefore, an impedance Z12 of C2 at the frequency f1 is given by $$Z12=Z1/2 \quad (4)$$

and an impedance Z21 of C1 at the frequency f2 is given by $$Z21=2*Z2 \quad (5).$$

In general, when a plurality of loads is connected in parallel to a signal source, a power distributed to a load with a lower impedance is higher than that distributed to a load with a higher impedance.

Based on the above consequence, since an impedance of C2 is low for a signal from the transmitting circuit 1, the signal easily leaks into the transmitting circuit 2 via C2 and an input to the detector circuit 14 decreases. On the other hand, impedance of C1 is high for a signal from the transmitting circuit 2, the signal barely leaks into the transmitting circuit 1 and an input to the detector circuit 14 does not decrease. In the formulation shown in FIG. 1A, it is easy to generate a detection voltage, which is higher than a certain level, of the transmitting circuit 2 for lower frequencies; however it is difficult to generate a detection voltage of the transmitting circuit 1 for higher frequencies.

Therefore, the leakage power should be reduced by forming a LPF circuit or a BPF (Band Pass Filter) circuit, between the capacitor C2 and the input terminal of the detector circuit 14, which selectively passes a signal of the frequency band for the transmitting circuit 2.

In the first mode of the present invention, a coil L1 and a coil L2 are inserted in series between the capacitor C2 and the input terminal of the detector circuit 14 as shown in FIG. 1B to increase the impedance and reduce the leakage power. The number of coils may be one. However, insertion of two coils allows a fine adjustment of the parameter.

Figure 2:
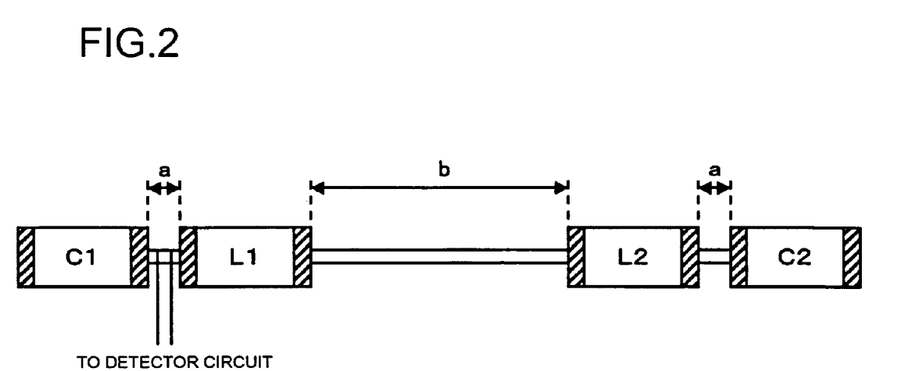
FIG. 2 is a diagram showing an arrangement of capacitors and coils in the transmitter of FIG. 1B.

The coil L1 is disposed near the capacitor C1 and the coil L2 is disposed near the capacitor C2 to prevent attenuation of output signals of the transmitting circuits due to formation of an unintentional stub in the pattern on the board. FIG. 2 is a diagram showing an arrangement of the coils L1, L2 and the capacitors C1, C2 in the transmitter in FIG. 1B. The coils L1, L2 and the capacitors C1, C2 are shown as a chip component whose striped area is a terminal of the chip component.

Figure 3A:
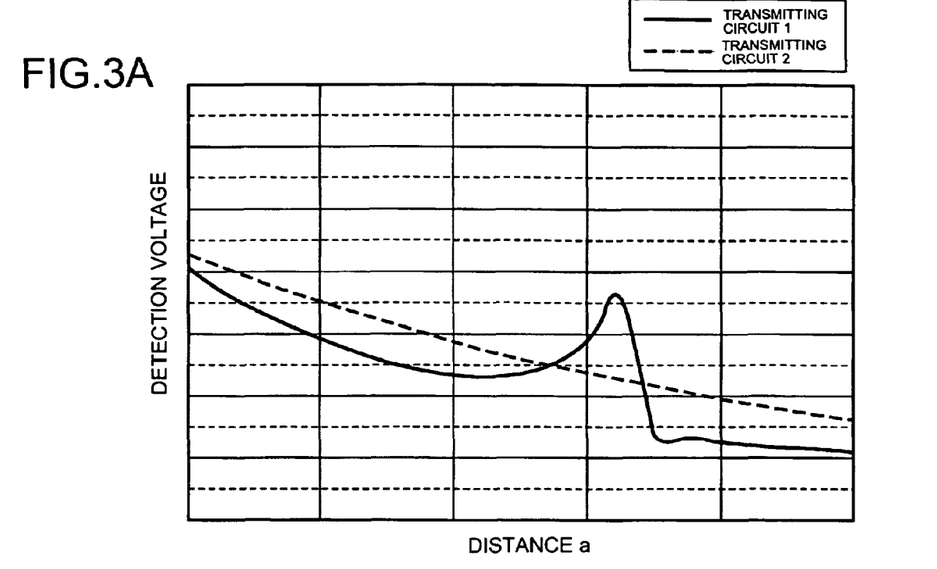
FIG. 3A is a diagram showing a simulation result of relationship between a distance 'a' and a detection voltage, where 'a' denotes a distance between a capacitor and an coil.
Figure 3B:
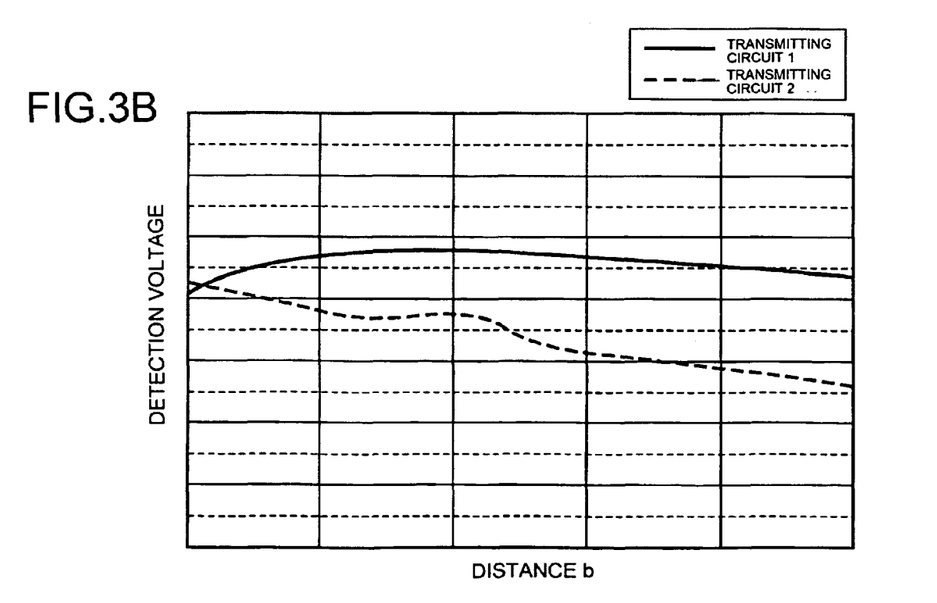
FIG. 3B is a diagram showing a simulation result of relationship between a distance 'b' and a detection voltage, where 'b' denotes a distance between coils.

As shown in FIG. 3A, the detection voltage decreases significantly depending on the distance a, when the coils L1 and L2 cannot be arranged, respectively, near the capacitors C1 and C2. On the other hand, as shown in FIG. 3B, the detection voltage does not decrease substantially, even when the distance b between the two coils L1 and L2 is increased.

The number of inserted coils may be only one as described above. In this case, the coil is arranged near one of the capacitors C1 and C2. The number of inserted coils may be three or more. In this case, the coils L1 and L2 are arranged, respectively, near the capacitors C1 and C2 as described above and the other coil is arranged between these coils L1 and L2.

Moreover, a capacitor can be inserted instead of the coils. Although the capacitors C1 and C2 are employed as the RF couplers 13 and 23, a directional coupler without a capacitor can also be employed.

As described above, in the first mode of the present invention, the power loss is decreased by connecting series coils between the RF coupler which is disposed on an output signal line of the transmitting circuit 2 and an input terminal of the detector circuit 14. Therefore, even when the detection circuit 14 is shared, a detection voltage higher than a certain level can be generated and a high degree of detection accuracy can be achieved by suppressing variation of the detection sensitivity which depends on the frequency.

Since it is not necessary to increase the coupling at the RF coupler, low current consumption is realized without increasing current consumption in the PA and the GCA, even when the detector circuit is shared.

A Second Mode

Figure 4:
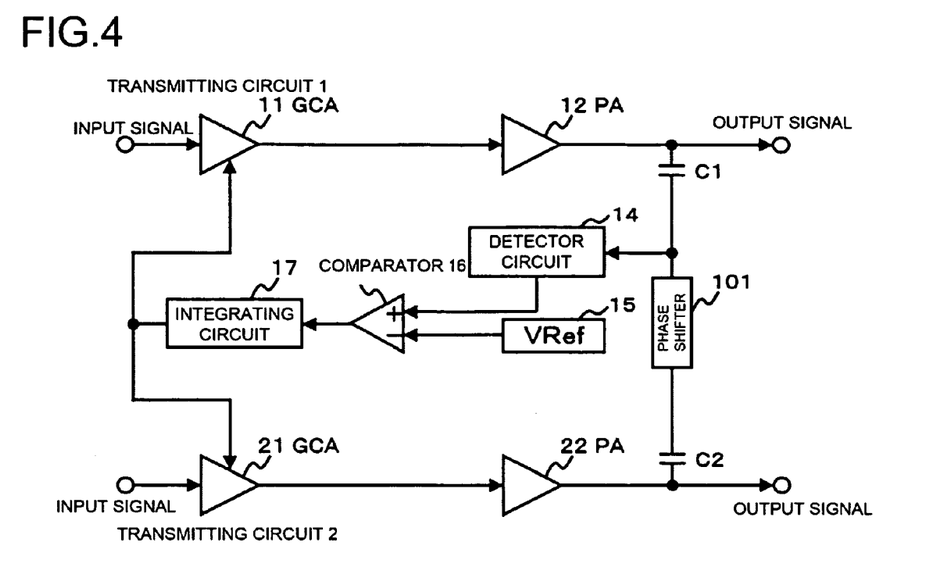
FIG. 4 is diagram showing a formulation of a transmitter according to a second mode of the present invention.

Next, a second mode of the present invention is explained. FIG. 4 is a diagram showing a formulation of a transmitter according to the second mode of the present invention, wherein an equivalent component with that in FIG. 1 is indicated by an identical reference numeral.

As shown in FIG. 4, a transmitter according to the second mode of the present invention is different from that in the first mode of the present invention shown in FIG. 1B in that a phase shifter which comprises, for example, L, C and R is disposed between a capacitor C2 and an input terminal of a detector circuit 14 instead of the coils L1 and L2.

A phase shifter shifts the phase of signals. The amount of phase shift by an identical phase shifter varies depending on the frequency. For example, a phase shifter which shifts a phase of signals of frequency f1 by 90 degrees shifts a phase of signals of frequency 2*f1 by 180 degrees.

In FIG. 4, a phase shifter 101 is arranged between a capacitor C2 and an input terminal of a detector circuit 14. Insertion of the phase shifter 101 allows a large phase shift of signals of the transmitting circuit 1 side while preventing a large phase shift of signals of the transmitting circuit 2 side which deals with lower frequency signals. The amount of the phase shirt of the phase shifter 101 is adjusted to a state where the impedance of the transmitting circuit 2 side for signals of the transmitting circuit 1 side can be regarded as nearly open.

This adjustment prevents leakage of transmitting signal power from the transmitting circuit 1 to the transmitting circuit 2 side and increases power supplied to the detector circuit 14. Therefore, a detection voltage for the transmitting circuit 1 side, which is higher than a certain level, is generated.

Although the capacitors C1 and C2 are employed as the RF couplers 13 and 23, a directional coupler without a capacitor may also be employed. A chip component may be employed as L, C and R composing the phase shifter. Moreover, the wire length between the capacitor C2 and the input terminal of the detector circuit 14 can be elaborated.

Figure 5:
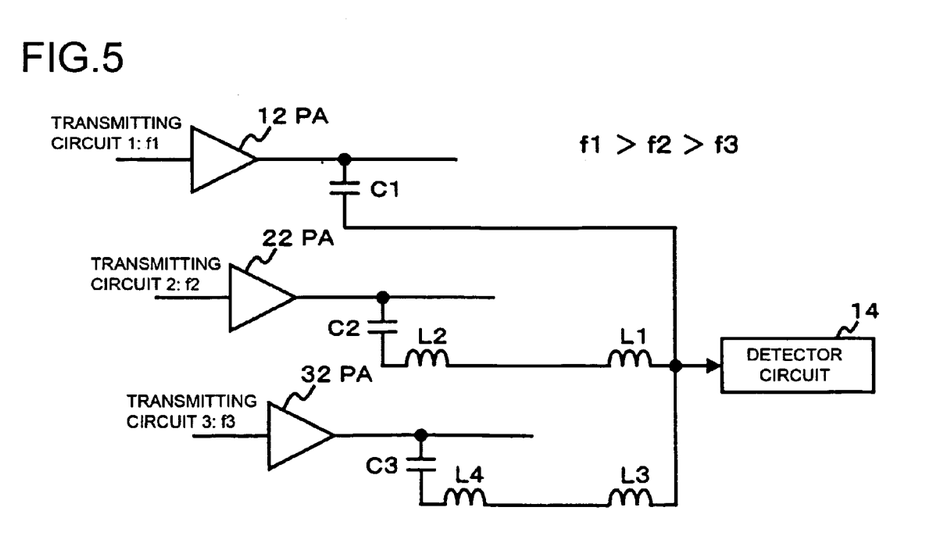
FIG. 5 is a diagram showing a formulation of transmitter according to a third mode of the present invention.

Next, a third mode of the present invention is illustrated. FIG. 5 is a diagram showing a structure of a transmitter according to a third mode of the present invention, where an equivalent component with that in FIG. 1 is indicated by an identical reference numeral.

As shown in FIG. 5, a transmitter according to the third mode of the present invention is different from that in the first mode of the present invention shown in FIG. 1B in that a transmitting circuit 3 dealing with signal of frequency f3 is composed in addition to a transmitting circuit 2 which deals with signals of frequency f1 and a transmitting circuit 3 which deals with signals of frequency f2. It is assumed that a relation f1>f2>f3 holds among these frequencies. The transmitting circuits 1, 2 and 3 operate exclusively to be another; while one of them is in operation, the others are stopped.

A GCA 11, a GCA 21, a reference voltage generator 15, a comparator 16 and an integrating circuit 17 shown in FIG. 1B are abbreviated in FIG. 5. It goes without saying that the transmitting circuit 3 comprises a GCA in addition to the PA 32 in the same way as the transmitting circuits 1 and 2 do; and the gain of the GCA in the transmitting circuit 3 is also controlled by an output from the integrating circuit 17 while the transmitting circuit 3 is in operation.

In FIG. 5, a capacitor C3 is employed as an RF coupler which is disposed on the output signal line of the transmitting circuit 3 and coils L3 and L4 are inserted in series between the capacitor C3 and an input terminal of the detector circuit 14. The coils L1 and L2 work as a BPF circuit which passes signals of a frequency band for the transmitting circuit 2; and the coils L3 and L4 works as a LPF circuit which passes signals of a frequency band for the transmitting circuit 3.

Here, the coils L3 and L4 are arranged, respectively, near the capacitors C1 and C3 in the same way as the coils L1 and L3 as described above with reference to FIG. 2.

The number of coils inserted between the capacitor C3 and the input terminal of the detector circuit 14 may be only one. In this case, the coil is arranged near one of the capacitors C1 and C3. The number of coils inserted between the capacitor C3 and the input terminal of the detector circuit 14 can be three or more. In this case, the coils L3 and L4 are arranged, respectively, near the capacitors C1 and C3 as described above and the other coils is/are arranged between the these coils L3 and L4.

Moreover, a capacitor may be inserted instead of the coils. Although the capacitors C1, C2 and C3 are employed as the RF couplers, a directional coupler without a capacitor can also be employed.

Within the scope of the entire disclosure (including the claims) of the present invention, and based further on the basic technological idea, the preferred modes can be changed and adjusted. Moreover, various combination or selection from the various elements disclosed within the scope of the claims of the present invention.

The invention claimed is:

1. A transmitter comprising:
   a first transmitting circuit which corresponds to a signal of a first frequency band;
   a second transmitting circuit which corresponds to a signal of a second frequency band having a lower frequency band than the first frequency band;
   a first coupler which, disposed on an output signal line of the first transmitting circuit, branches and outputs part of an output signal from the first transmitting circuit;
   a second coupler which, disposed on an output line of the second transmitting circuit, branches and outputs part of an output signal from the second transmitting circuit; and
   a detector circuit detecting an input signal whose input terminal is coupled to a branched output terminal of the first coupler and a branched output terminal of the second coupler,
   wherein said input terminal is directly connected to the branched output terminal of the first coupler; and
   a filter circuit which, arranged between the input terminal and the branched output terminal of the second coupler, selectively passes a signal of the second frequency band.

2. The transmitter of claim 1, wherein said filter circuit is comprises a series of coils arranged between said input terminal and said branched output terminal of the second coupler.

3. The transmitter of claim 2, wherein the first coupler is comprises a first capacitor whose first terminal is coupled to an output signal line of the first transmitting circuit and second terminal is coupled to the input terminal;
   the second coupler is a second capacitor whose first terminal is connected to an output signal line of the second transmitting circuit;
   a first coil of the coils, whose first terminal is connected to said input terminal, is disposed near the first capacitor; and
   a second coil of the coils, whose first terminal is connected to a second terminal of the first coil and second terminal is connected to a second terminal of the second capacitor, is disposed near the second capacitor.

4. The transmitter of claim 2, wherein the coil is substituted by a capacitor.

5. The transmitter of claim 1, further comprising:
   a third transmitting circuit which corresponds to signals of a third frequency band having a lower frequency band than the second frequency band; and
   a third coupler which, disposed on an output signal line of the third transmitting circuit, branches and outputs part of an output signal from the third transmitting circuit,
   wherein a filter circuit which, arranged between the input terminal and a branched output terminal of the third coupler, selectively passes a signal of the third frequency band.

6. A transmitter comprising:
   a first transmitting circuit which corresponds to a signal of a first frequency band;
   a second transmitting circuit which corresponds to a signal of a second frequency band having a lower frequency band than the first frequency band;
   a first coupler which, disposed on an output signal line of the first transmitting circuit, branches and outputs part of an output signal from the first transmitting circuit;
   a second coupler which, disposed on an output line of the second transmitting circuit, branches and outputs part of an output signal from the second transmitting circuit; and
   a detector circuit detecting an input signal whose input terminal is coupled to a branched output terminal of the first coupler and a branched output terminal of the second coupler,
   wherein said input terminal is directly connected to the branched output terminal of the first coupler; and
   a phase shifter, providing a signal of the first frequency band with a larger phase shift than that for a signal of the second frequency band, is arranged between said input terminal and said branched output terminal of the second coupler.

7. The transmitter of claim 1, further comprising a controller which variably controls a gain of a variable gain amplifier in the first transmitting circuit based on a detection output of the detector circuit while the first transmitting circuit operates and variably controls a gain of a variable gain amplifier in the second transmitting circuit based on a detection output of the detector circuit while the second transmitting circuit operates.

8. A transmitter comprising:
   a first transmitting circuit which corresponds to a signal of a first frequency band;
   a second transmitting circuit which corresponds to a signal of a second frequency band having a lower frequency band than the first frequency band; a detector circuit which detects an input signal;
   a first coupler which, disposed on an output signal line of the first transmitting circuit, branches and outputs part of an output signal from the first transmitting circuit to the detector circuit; and
   a second coupler which, disposed on an output line of the second transmitting circuit, branches and outputs part of an output signal from the second transmitting circuit to the detector circuit; and
   the transmitter further comprising, between the second coupler and the detector circuit, one of a filter circuit which selectively passes a signal of the second frequency band and a phase shifter which provides a signal of the first frequency band with a larger phase shift than that for a signal of the second frequency band.

9. The transmitter of claim 8, further comprising:
   a third transmitting circuit which corresponds to signals of a third frequency band having a lower frequency band than the second frequency band; and
   a third coupler which branches part of an output signal of the third transmitting circuit in an output signal line of the third transmitting circuit and outputs the part to the detector circuit, and
   a second filter circuit which, arranged between the second coupler and the detector circuit, selectively passes a signal of the third frequency band.

10. The transmitter of claim 8, wherein both of the filter circuits comprise a coil or a series of coils.

11. The transmitter of claim 8, wherein both of the filter circuits comprise a capacitor.

12. The transmitter of claim 8, wherein both of the first coupler and the second coupler are a capacitor.

13. The transmitter of claim 8, further comprising a controller which variably controls a gain of a variable amplifier in the first transmitting circuit based on a detection output of the detector circuit while the first transmitting circuit operates and variably controls a gain of a variable gain amplifier in the second transmitting circuit based on a detection output of the detector circuit while the second transmitting circuit operates.

* * * * *